(12) United States Patent
Lewis et al.

(10) Patent No.: US 6,236,217 B1
(45) Date of Patent: May 22, 2001

(54) CABLE FAULT MONITORING SYSTEM

(76) Inventors: Andrew Biggerstaff Lewis, 30 Grangeville Close, Bristol BS30 9YJ; Andrzej Zbigniew Regini, 11 Westbury Road, Westbury-on-Trym, Bristol BS9 3AY, both of (GB)

( * ) Notice: Subject to any disclaimer, the term of this patent is extended or adjusted under 35 U.S.C. 154(b) by 0 days.

(21) Appl. No.: 09/242,458
(22) PCT Filed: Aug. 6, 1997
(86) PCT No.: PCT/GB97/02122
 § 371 Date: Feb. 17, 1999
 § 102(e) Date: Feb. 17, 1999
(87) PCT Pub. No.: WO98/08104
 PCT Pub. Date: Feb. 26, 1998

(30) Foreign Application Priority Data

Aug. 22, 1996 (GB) .................................................. 9617606

(51) Int. Cl.$^7$ .................................................. G01R 31/08
(52) U.S. Cl. .......................................... 324/523; 324/552
(58) Field of Search .................................. 324/539, 525, 324/541, 523, 552, 627

(56) References Cited

U.S. PATENT DOCUMENTS

| 4,110,683 | * | 8/1978 | Cason et al. ......................... 324/552 |
| 4,947,469 | * | 8/1990 | Vokey et al. ......................... 324/523 |
| 5,990,686 | * | 11/1999 | Vokey et al. ......................... 324/523 |

OTHER PUBLICATIONS

Japan Patent abstract (55062369).*

* cited by examiner

*Primary Examiner*—Safet Metjahic
*Assistant Examiner*—Vincent Q. Nguyen
(74) *Attorney, Agent, or Firm*—Woodbridge & Associates, P.C.; Richard C. Woodbridge

(57) ABSTRACT

A method of detecting faults on a cable (1) is provided, such a cable (1) having a conductive path, there being a number of sensors (5a, 5b, 5c, 5d, 5e) along the length of the cable (1), each of the sensors shaving a resistance measurement device for detecting the cable to ground resistance of the respective section of the cable (1). The cable to ground resistance at the respective sections are measured and compared with a predetermined value, and if the cable to ground resistance of any one particular section is less than the predetermined value, it is determined that a fault is present in that section.

8 Claims, 2 Drawing Sheets

CABLE FAULT MONITORING SYSTEM

Figure 1:
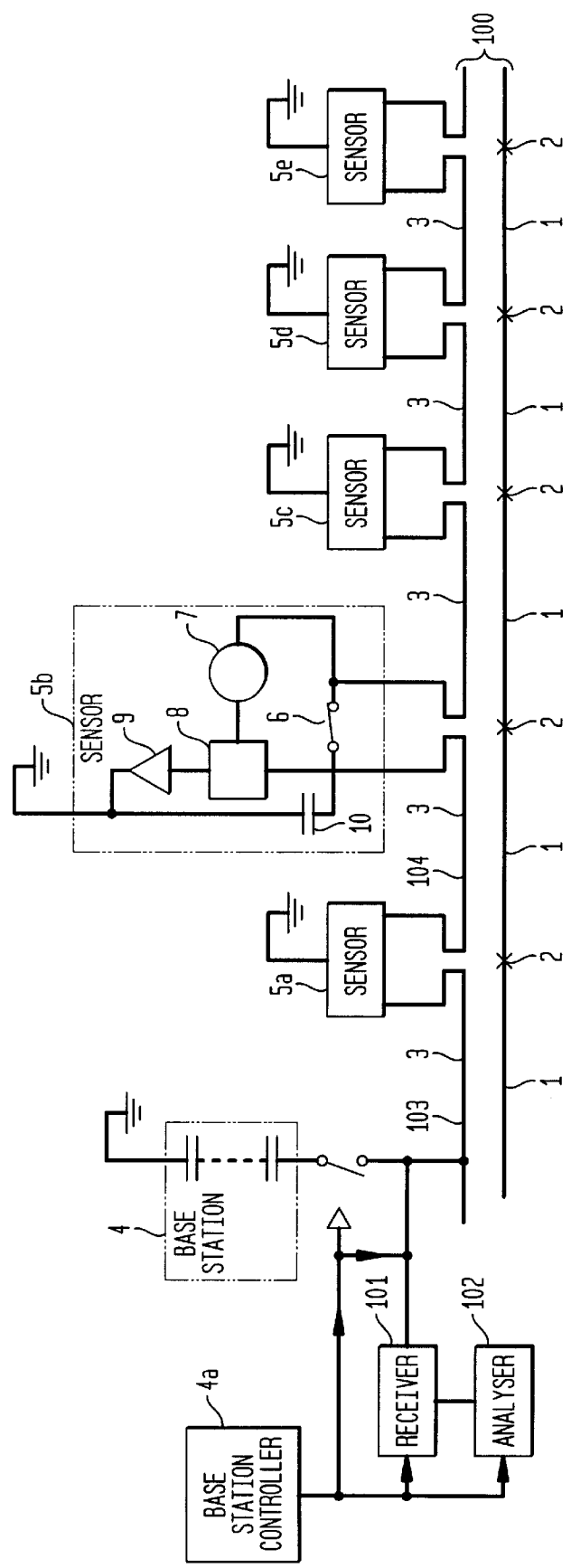

The present invention relates to a cable fault monitoring system. It is concerned particularly, but not exclusively, with the monitoring of sheaths of underground cables where damage to the outer insulation gives rise to a conduction path from an inner metallic element to ground.

It is known that where the insulation of an underground cable is damaged, the short between the metallic element of the cable and ground causes corrosion to occur if left unprotected.

Known techniques for location of faults from the end(s) of the cable fail when there are multiple faults present in the cable. Faults may be divided into primary faults, with low impedance, and secondary faults with higher impedance. Where there is a primary and a secondary fault on the line, the accuracy of location of the primary fault will be affected by the existence of the secondary fault. If there are multiple primary faults, it is not possible to identify them separately, and hence locate them. This problem is particularly acute where DC measurements are made from each end of the cable, since in that case it becomes impossible to resolve more than one fault. In general, DC measurement techniques are preferable, because of the attenuation of high frequency signals over long distances, due to signal current leaking to ground through capacitive coupling.

It would be possible to resolve multiple faults by use of time domain reflectometry. However, it has been found that the impedance and attenuation of typical cable sheaths generally precludes the use of time domain reflectometry techniques. This is particularly true where signals are to be applied to the conductive sheath of a fibre optic cable.

It is also possible to provide a plurality of sensors along the cable, each of which is capable of detecting voltage (and possibly current) values at each location along the cable and transmitting those values to an analysis station. That analysis station then analyses the values along the length of the cable, to determine the location of the or each fault by extrapolation between the values generated by the sensors.

JP-A-55-562364 discloses an arrangement in which currents at each end splice along a cable are used to trigger respective links between auxiliary lines running along the cable, to enable the distance to the fault to be determined at a base station to which the auxiliary lines are connected.

The present invention operates on a third principle. It proposes that a plurality of sensors are provided along the cable, each of which is capable of measuring the cable-to-ground resistance of a section of the sheath of the cable, using a resistance measurement device in the sensor. The results of the resistance measurements may then be transmitted to an analysis station.

If a section of cable on which a measurement is made is intact, its cable-to-ground conductance will be low (in the order of micro-siemens/km). However, if the cable is damaged, and there is a conduction path from the sheath to ground, the resistance measured will be much less.

In order to lay a long line of cable, sections of optical fibre, with a length of about 2 km, are connected by splice joints. It is therefore convenient to locate the sensors at such splices, since the sections of the sheath are accessible there for electrical connection.

Preferably, each sensor contains a switch, eg. a remotely activatable software-controlled electronic switch, which connects or disconnects the sheath of two separate sections of the cable. When the switches at each end of a section are open, that section is isolated from the rest of the cable and appropriate resistance measurements can be taken. If the sensor then signals back to a base station, and this process is repeated for each cable section, it can be determined if any section contains a fault. It can be noted that this permits multiple faults to be detected since measurements are carried out on each section separately. Preferably, the values determined by each sensor are transmitted to the analysis station via the cable itself, but telecommunication transmission systems are also possible.

Figure 2:
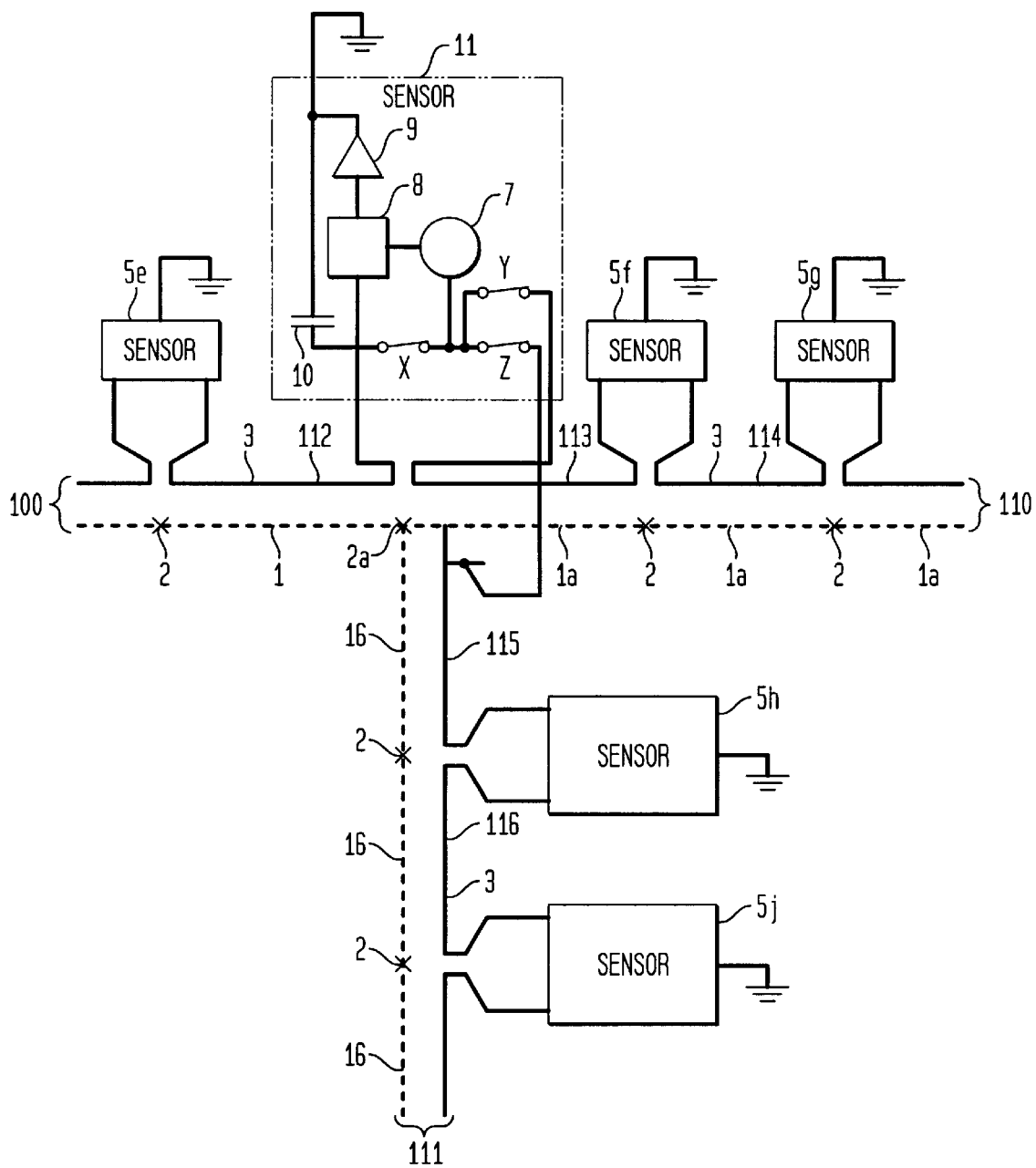

Embodiments of the present invention will now be described in detail, by way of example, with reference to the accompanying drawings, in which FIG. 1 shows a schematic view of a first embodiment of a locating system for a cable according to the present invention; and FIG. 2 shows a schematic view of a second embodiment, applied to a branched cable.

In FIG. 1 a cable 100 has a plurality of sensors 5a to 5e along its length. Each sensor 5a to 5e has a similar structure, and only sensor 5b is shown in detail. The cable 100 is a fibre optic cable having a main cable path 1 and a sheath 3. The main cable path 1 is in a series of sections joined by splice joints 2. The sheath 3 is discontinuous at the site of the splice joints 2. A base station 4 is connected to the sheath 3 and applies a voltage thereto, the voltage preferably being a negative voltage to avoid anodic corrosion. The base station 4 is controlled by a base station control unit 4a, which operates using suitable software. A receiver 101 and an analyser 102 are also connected to the sheath 3, to analyse signals from the sensors 5a to 5e, as will be described later. The receiver 101 and analyser 102 are controlled by the base station control unit 4a, as in a switch 46 to selectively connect the base station 4 or the receiver 101 to the sheath 3.

As can be seen from the sensor 5b, the sections of the sheath 3 on either side of the sensor 5b are interconnected by a switch 6, which switch 6 is normally closed. The switch 6 may be an electronic switch controlled by suitable software. It is preferred for the switch to be normally closed as it gives benefits such as continuity of line for location purposes, although it is possible to design a system within the present invention which operates with switches normally open. The switches would then close in sequence intermittently for continuity and resistance measurement checks. The sensor 5b also contains a means 7 of measurement resistance on the megohm range, such as a megohm meter or an electronic equivalent thereof, a microprocessor and a data transmitter 9. A capacitor 10 is connected across the sensor circuit to ground, so that the capacitor 10 is charged to the voltage which is applied to the sheath 3 by the base station 4. The time for the capacitor of each sensor 5a to 5e to charge will increase with distance from the base station 4, but the maximum charging time will readily be ascertained, and the system can be operated to ensure that the intervals between resistance measurement times are sufficiently long that the capacitors 10 of all the sensors 5a to 5e will be fully charged at the time of the measurement.

With all capacitors fully charged, a monitoring sequence can be triggered. A simple triggering signal can be generated by interrupting the voltage supplied by the base station 4 for a short time, which will provide a voltage pulse on the sheath which is detectable by the microprocessor 8 of each sensor 5a to 5e. At a suitable time from the pulse, the microprocessor 8 of each sensor 5a to 5e controls the switch 6 of the corresponding sensor 5a to 5e.

In the embodiment illustrated, the first stage in the sequence of measurement occurs when the switches 6 of the sensors 5a, 5b are opened. The opening of these switches isolates the section 104 of the sheath 3 between the sensors 5a, 5b, and a resistance measurement is carried out on that section by the resistance-measurement means 7 of the sensor 5a. Assuming that there is no sheath-to-ground fault in the section 104, the resistance by the resistance-measurement means 7 of the sensor 5a will be high. If, however, there is a sheath-to-ground fault, the resistance will be much lower so that the measurement of resistance will provide a way of determining whether the section 104 is satisfactory or not.

Once the resistance-measurement means 7 of the sensor 5a has measured the resistance in section 103, and the microprocessor 8 of sensor 5a records the data, the switches 6 of the sensors 5a and 5b are closed and the data is transmitted via the data transmitter 9 to the receiver 101. Since the switch 6 of sensor 5a is closed at this time, there is a signal path along the sheath 3 from the sensor 5a to the receiver 101. Of course, other signalling methods such as radio transmission may be used. Power for this operation is provided by the capacitor 10 of the sensor 5a.

After a suitable time interval, the switches 6 of sensors 5b and 5c are opened to enable the resistance-measurements means 7 of the sensor 5b to measure the resistance in the next section of the sheath 3. This process can be repeated along the cable 100 until all the sections of the sheath 3 have been measured. It may be noted that the length of the cable between the base station 4 and the first sensor 5a is normally short, and often visible, and therefore there is less need to carry out a measurement on it. If necessary, the sensor 5a is at, or very close to, the base station 4.

Once this process has been repeated for all the sensors 5a to 5e, the results can be analysed by an analyser 102. The monitoring sequence can be repeated at appropriate time intervals, to permit the analyser to detect faults along the cable 100. From a very long cable, the data from all the sensors can be logged, or measurements recorded only when changes are detected.

It may be noted that although the embodiment illustrated has five sensors, the present invention is applicable to arrangement using any number of sensors along the length of the cable.

The embodiment described above has a simple single cable between two points. In fact, many cables will be branched with tee joints, and an embodiment illustrating such a system is shown in FIG. 2. In the embodiment of FIG. 2, the cable 100 of FIG. 1 divides into two branches 110, 111. There is a splice 2a at the junction. As illustrated in FIG. 2, the branch 110 has sensors 5f, 5g thereon, in a similar way to sensors 5a to 5e of the cable 100. Similarly branch 111 has sensors 5h, 5j thereon. In addition, there is a sensor 11 at the splice 2a which is similar to the other sensors, but has three switches x y and z therein. Switch x corresponds generally to the switch 6 of sensor 5b and permits measurements to be carried out on the preceding section 112 of the sheath 3 of the cable 100, switches y and z permit selection between the branches 110 and 111.

With such an arrangement, all three switches x y and z are initially closed to permit charging of the capacitor 10 of the sensors 5a to 5j and 11. Measurements are then carried out on the cable 100, as has previously been described in the first embodiment. When the section 112 of the sheath 3 between sensors 5e and 11 is to be measured, switch x is opened as is switch 6 of sensor 5e, to permit a measurement to be carried out by sensor 5e in a similar way to that previously described. Those switches are then closed to permit the capacitors to recharge and data to be transmitted. When measurements are to be carried out on branch 110, both switches x and z are opened, as is switch 6 of sensor 5f. A measurement can then be carried out on the section 113 of the sheath 3 of the branch 110. The switches are then closed for recharging and data transmission. The process for measurement on the section 114 between sensor 5f and 5g of branch 110 is the same as for e.g. sensors 5a and 5b, and therefore will not be described in more detail.

When a measurement is to be carried out on section 115 of branch 111, switches x and y of sensor 11 are opened, together with the switch 6 of sensor 5h. This permits a resistance measurement to be carried out on the section 115 by sensor 11. The switches are subsequently closed for data transmission and recharging. The measurement on the section 116 between sensors 5h and 5j can then be the same as previously described for the sensors 5a and 5b.

The above embodiments described sequential measurement and retransmissions of resistance data for each section of the cable. However, the present invention is not limited to this. Measurements can, in principle, be carried out in any order along the cable. It would be possible also for all the measurements to be stored at the sensors until all have been collected. Also, data transmitted from each sensor may include additional items such as confirmation of sensor identity, temperature, voltage level or other data as required. In some cases, this may require appropriate sensing means in the sensors, which are not shown in the embodiments.

What is claimed is:

1. A method of detecting faults on a cable (1) comprising the steps of:

providing a conductive path (3), there being a plurality of sensors (5a, 5b, 5c, 5d, 5e) along the cable (1), each of said sensors having a resistance measurement device (7) for measuring the cable-to-ground resistance of a respective section of the conductive part of the cable (1), wherein the cable-to-ground resistance of each respective section is measured by the corresponding resistance measurement device (7); and, measuring resistance and comparing with a predetermined value, thereby to detect a fault in one of the sections when the cable-to-ground resistance of that section is less than the predetermined value.

2. A method according to claim 1, wherein the conductive part (3) of the cable is a sheath of the cable.

3. A method according to claim 1, wherein the cable-to-ground resistance of the respective sections are measured sequentially along the cable (1).

4. A method according to claim 1, wherein the cable (1) has a plurality of sections and splices therebetween, and the sensors (5a, 5b, 5c, 5d, 5e) are located at the splices (2).

5. A method according to claim 4, wherein the sensors (5a, 5b, 5c, 5d, 5e) each include a switch (6) for interconnecting the conductive part of the cable (1) on either side of the corresponding splice (2), the opening and closing of the switches (6) being controlled to selectively permit the ground-to-cable resistance of different ones of the sections to be measured.

6. A method according to claim 1, wherein the measurement by the measurement devices (7) are controlled by a common controller (4a) connected to the cable.

7. A method according to claim 6, wherein signals between the controller (4a) and the measuring devices (7) pass via the cable (1).

8. A cable system comprising:

a cable (1) having a conductive part (3), a plurality of sensors (51, 5b, 5c, 5d, 5e) along the cable (1), each sensor having a resistance measurement device (7) for measuring the cable-to-ground resistance of a respective section of the cable (1); and, a controller (4a) for comparing the cable-to-ground resistances measured by each sensor with a predetermined value, thereby to detect a fault in one of the sections when the cable-to-ground resistance of that section is less than the predetermined value.

* * * * *

UNITED STATES PATENT AND TRADEMARK OFFICE
CERTIFICATE OF CORRECTION

PATENT NO.    : 6,236,217 B1                                              Page 1 of 1
DATED         : May 22, 2001
INVENTOR(S)   : Andrew Biggerstaff Lewis and Andrzej Zbigniew Regini It is certified that error appears in the above-identified patent and that said Letters Patent is hereby corrected as shown below:

Title page,
Insert Item [73], Assignee: RADIODETECTION LIMITED
Western Drive
Bristol BS14 0AZ, England Signed and Sealed this Twenty-third Day of April, 2002

*Attest:*

*Attesting Officer*

JAMES E. ROGAN
*Director of the United States Patent and Trademark Office*